United States Patent [19]

Iijima et al.

[11] Patent Number: 4,782,329

[45] Date of Patent: Nov. 1, 1988

[54] DISPLACEMENT DETECTOR FOR AN ENCODER

[75] Inventors: Kenzaburou Iijima; Yoshinori Hayashi, both of Hamamatsu, Japan

[73] Assignee: Nippon Gakki Seizo Kabushiki Kaisha, Japan

[21] Appl. No.: 44,816

[22] Filed: Apr. 30, 1987

[30] Foreign Application Priority Data

May 1, 1986 [JP] Japan .................................. 61-101809
Jun. 13, 1986 [JP] Japan .................................. 61-137569

[51] Int. Cl.$^4$ .............................................. H02M 1/48
[52] U.S. Cl. ............................................ 341/6; 341/15
[58] Field of Search ................................. 340/347 SY

[56] References Cited

PUBLICATIONS

ILC Data Device Corporation Catalog, SDC-19100 Monobrid Series, pp. 202–207, 1985.

Primary Examiner—William M. Shoop, Jr.
Assistant Examiner—Richard K. Blum
Attorney, Agent, or Firm—Ostrolenk, Faber, Gerb & Soffen

[57] ABSTRACT

In construction of a displacement detector for an encoder provided with a phase locked loop connected to a detection head facing a scale of the encoder, use of a signal switching circuit allows optimum selection of signals used for generation of a system output signal depending on the speed of the relative movement between the detection head and the scale, thereby assuring generation of the system output signal at high degree of dissolution at any speed of the relative movement. Further, additional use of a parallel/serial converting unit assures high reliability in transmission of the system output signal to external systems.

11 Claims, 4 Drawing Sheets

DISPLACEMENT DETECTOR FOR AN ENCODER

BACKGROUND OF THE INVENTION

The present invention relates to a displacement detector for an encoder well suited for detection of angular or positional displacement.

Various detectors have been developed and used in practice for detection of displacement through demodulation of output signals of an encoder. One typical example of such a conventional displacement detector is given in the form of an electronic phase-locked loop as later described in more detail. In summary, such a displacement detector includes a detection head made up of a pair of spaced magnetic sensors arranged facing a scale of an encoder. The scale is either circular or linear and includes a series of aligned magnetic domains of a similar period. The magnetic sensors and the scale are arranged for a prescribed relative movement.

During the relative movement, the magnetic sensors sequentially issue a series of phased output signal pairs in response to change in intensity of magnetic field generated by the magnetic domains of the scale of the encoder. After described signal processing through various circuit elements, the displacement detector issues a series of system outputs in the form of displacement data which indicate the instant position of the magnetic sensors with respect to the scale of the encoder. Each displacement data Dout is made up of output signals issued by a pair of counters in a parallel mode. The output signal of one counter forms higher bits of the displacement data Dout and indicates the instant position of the magnetic sensors with respect to the scale, i.e. the number of the magnetic domains passed by the magnetic sensors. Whereas the output signal of the other counter forms lower bits of the displacement data Dout and indicates the instant position of the magnetic sensors within a magnetic domain now being passed by the magnetic sensors.

It is now assumed with the above-described circuit of the displacement detector that the scale contains 1024 magnetic domains and the first-named counter has 8 bits. When the rotation speed of the scale is equal to 1 RPS (rotation per second), the frequency of the lowest bit of the first-named counter amounts to about 260 kHz.

A rotary encoder is required to have a function to perform exact detection of position even at a rotation speed of the scale in a range from 6 to 60 RPS. The above described circuit assures detection of position with high degree of dissolution when the rotation speed of the scale is relatively low. However, the circuit cannot follow well high speed rotation of the scale due to slow response of the phase locked loop and such poor function at high rotation speed degrades the accuracy of the count value $\phi$ of the first-named counter which indicates the instant position of the one magnetic sensor within a magnetic domain. Such inexact displacement data are issued from the circuit without any proper compensation.

In the case of the above-described circuit, the output signal N of the second-named counter and the count value $\phi$ of the first-named counter are issued in a parallel mode to form the displacement data Dout. As a consequence, the number of cables used for signal transmission must be equal or larger than the number of bits of the displacement data Dout. When the displacement data Dout is supplied outside the system in such a parallel mode, there is a great possibility of transmission error due to noise etc., thereby lowering reliability of the detection.

Further in the case of the above-described conventional circuit, the count values of the counters are not held when the power source is deactivated. As a result, no displacement data Dout can be issued right after activation of the power source. It is thinkable to use a proper external memory in order to provisionally store the displacement data Dout at deactivation of the power source. In this case, however, the displacement data Dout stored at the memory differs from the actual displacement should the scale move after deactivation of the power source.

SUMMARY OF THE INVENTION

It is the basic object of the present invention to provide a displacement detector for an encoder which is capable of constantly issuing exact displacement data without any influence of the speed of displacement at the relative movement between the detection head and the encoder.

It is another object of the present invention to provide a displacement detector for an encoder which issues displacement data in a serial mode for high reliability of detection.

It is other object of the present invention to provide a displacement detector for an encoder which is able to correctly issue instant displacement data even right after activation of the power source.

In accordance with the basic aspect of the present invention, a displacement detector comprises a detection head arranged facing a scale of an encoder for a relative movement and generative of a pair of phased output signals corresponding to the intensity of a signal stored in the scale; the first and second A/D converters connected to the detection head for digitalization of the output signals; a function generating and multiplying unit connected to the first and second A/D converters and generative of the first product of multiplication of an output signal from the first A/D converter with a cosine value of prescribed data and the second product of multiplication of an output from the second A/D converter with a sine value of the prescribed data; a reducer connected to the function generating and multiplying unit and for calculating the difference between the first and second products of multiplication; the first counting unit connected to the reducer and the function generating and multiplying unit, which performs counting corresponding to the difference in product of multiplication, shifts its mode of counting depending on the polarity of the difference and passes its count value as the above-described prescribed data to the function generating and multiplying unit; a signal switching unit connected to the detection head and the first counting unit, which detects a speed of the relative movement, selects one of the output signals from the detection head after wave shape discrimination when the speed exceeds a standard speed, and selects a signal in the highest bit of the count value from the first counting unit when the speed falls short of the standard value; a second counting unit connected to the signal switching unit and for counting an output signal from the latter; and a parallel/serial converting unit connected to the second counting unit and the first counting unit, which converts first absolute data, which includes lower bits formed by the count value of the first counting unit and higher bits formed by a count value of the second counting unit, to corresponding first serial data when the speed of the relative movement falls short of the standard speed, and converts second absolute data, which includes higher bits formed by the count value from the second counting unit, to corresponding second serial data after invalidation of the count value from the first counting unit when the speed exceeds the standard speed.

DESCRIPTION OF THE PREFERRED EMBODIMENTS

Figure 6:
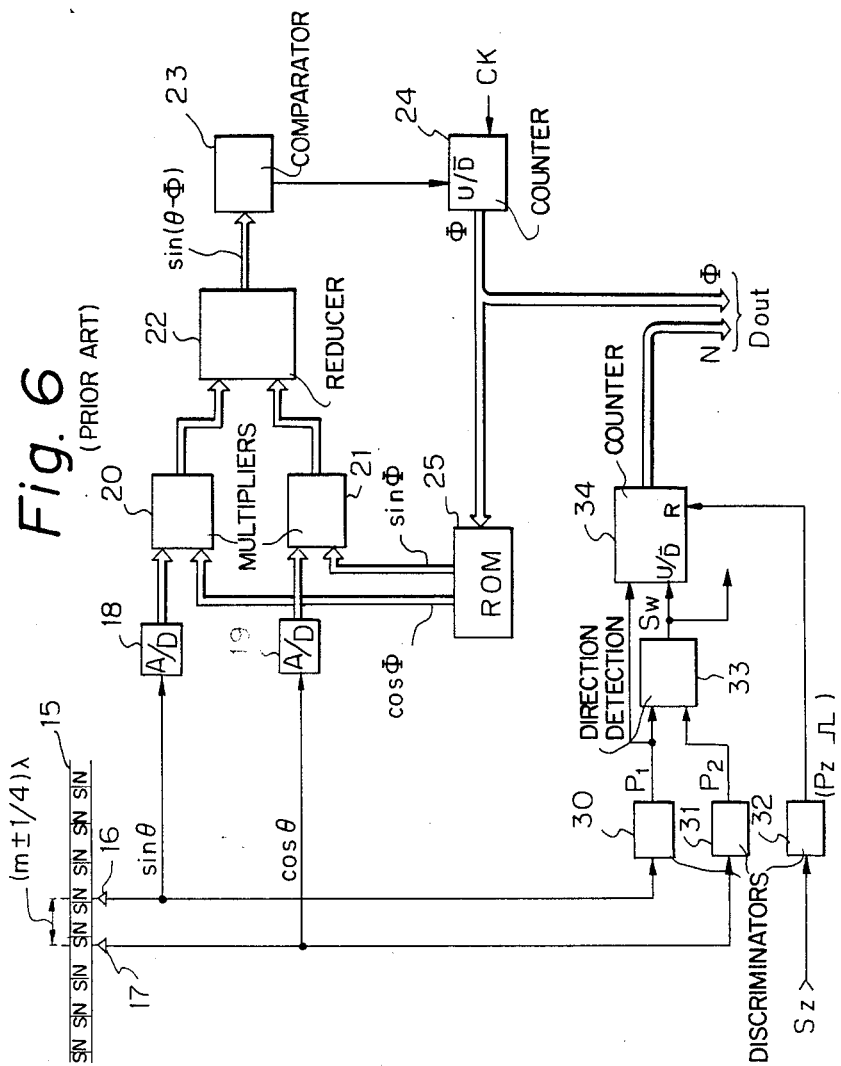
FIG. 6 is a circuit diagram of a typical conventional displacement detector.

Various detectors have been developed and used in practice for detection of displacement through demodulation of output signals of an encoder. One example of such a conventional displacement detector is shown in FIG. 6, in which a scale 15 is formed by magnetizing a given track with a sine wave of a constant period. Usually such a scale 15 takes the form of a magnetized circular track on a magnetic circular disc. The wavelength $\lambda$ of the sine wave used for magnetization is chosen in a range from several tens to several hundreds $\mu$m. A pair of magnetic sensors 16 and 17 are arranged facing the scale 15 to generate level signals corresponding to the intensity of magnetization on the scale 15. The output signals of such sensors 16 and 17 should contain no carrier waves. For example, semiconductor elements are used for the sensors. The sensors 16 and 17 are phased from each other by $\lambda/4$ (90 degrees). In other words, the sensors 16 and 17 are spaced apart from each other by a distance equal to $(m \pm \frac{1}{4})\lambda$, m being a positive integer. The scale 15 and the magnetic sensors 16, 17 are arranged for relative rotation. When the magnetic sensor 16 generates a sine wave output signal, the magnetic sensor 17 generates a cosine wave output signal. When the period $\theta$ of one cycle of the sine wave used for magnetization, i.e. the inter-pole distance of the scale 15, spans $0-2\pi$, the magnetic sensors 16 and 17 generate output signals equal to $\sin\theta$ and $\cos\theta$.

The magnetic sensors are connected to input terminals of respective multipliers 20 and 21 via respective A/D converters 18 and 19 which digitalize the output signals from the magnetic sensors 16 and 17. Output signals of the multipliers 20 and 21 are passed to terminals of a reducer 22 whose output signal is passed to a digital comparator 23. The comparator 23 supplies a $U/\overline{D}$ signal to an up-down shifting terminal of a counter 24. The $U/\overline{D}$ signal assumes a value "1" when the result of reduction is below 0, and a value "0" when the result of reduction is above 0. Clock pulses are also supplied to the counter 24. The counter 24 is set in an up-mode on receipt of a "1" signal, and in a downmode on receipt of a "0" signal from the comparator. The $U/\overline{D}$ counter 24 is connected to a function generating ROM 25 which stores $\sin\phi$ and $\cos\phi$ data. These data are sequentially read out in accordance with count values $\phi$. The data $\cos\phi$ are passed to the other input terminal of the multiplier 20 whereas the data $\sin\phi$ are passed to the other input terminal of the multiplier 21. With this construction, the output of the reducer is equal to $\sin(\theta - \phi)$. The comparator 23 generates a "1" $U/\overline{D}$ signal when $\sin(\phi - \phi)$ is positive, and a "0" $U/\overline{D}$ signal when $\sin(\theta - \phi)$ is negative. The count values $\phi$ of the counter 24 changes depending on the polarity of $\sin(\theta - \phi)$.

The magnetic sensors are also connected to respective wave shape discriminating circuits 30 and 31. Each discriminating circuit discriminates the output signal from the associated magnetic sensor with a given threshold value and generates a two-value signal of a "1" level or a "0" level. Output signals $P_1$ and $P_2$ of the discriminating circuits 30 and 31 are given in the form of square waves phased by $\pi/2$. When the magnetic sensors 16 and 17 move in the positive direction, the one output signal $P_1$ advances. When the magnetic sensors 16 and 17 move in the negative direction, the other output signal $P_2$ advances. The wave shape discriminating circuits 30 and 31 are connected to a common direction discriminating circuit 33 which discriminates the moving direction of the magnetic sensors 16 and 17. The output signal Sw of the direction discriminating circuit 33 is, on one hand, passed to the up-down shifting terminal of a counter 34 and, on the other hand, supplied to an external system. The counter 34 counts the output signal Sw from one wave shape discriminating circuit 33. The counter 34 is set in an up-mode when the magnetic sensors 16 and 17 move in the positive direction, and in a down-mode when the magnetic sensors 16 and 17 move in the negative direction. Every time the magnetic sensors 16 and 17 complete one cycle rotation, a zero-point signal Sz is generated at the reference position and supplied to the reset terminal of the above-described counter 34 via a wave shape discriminating circuit 32. Thus the counter 34 is reset every time the magnetic sensors 16 and 17 pass by the reference position. As a consequence, the count values of the counter 24 corresponds to the number of magnetic domains on the scale which have been passed by the magnetic sensors 16 and 17 between the current and reference positions.

The output N of the counter 34 forms the higher bits of the displacement data Dout whereas the output of the counter 24 forms the lower bits of the displacement data Dout.

When the magnetic sensors 16 and 17 move in the positive direction, the counter 34 performs up-mode counting as each magnetic domain is passed by, and the count values are generated for the higher bits of the displacement data Dout. As a consequence, the higher bits of the displacement data Dout indicate the number of the magnetic domains already passed by the magnetic sensors 16 and 17, that is the current position of the magnetic sensors 16 and 17 with respect to the reference position.

After digitalization by the A/D converters 18 and 19, the signals $\sin\theta$ and $\cos\theta$ from the magnetic sensors 16 and 17 are multiplied by the signals $\cos\phi$ and $\sin\phi$ generated by the function generating ROM 25 and the product of multiplication is supplied to the reducer 22 for detection of $\sin(\theta - \phi)$. The count value $\phi$ of the counter 24 varies depending on the polarity of $\sin(74 - \phi)$ to vary the output signals $\sin\phi$ and $\cos\phi$ of the function generating ROM 25 in accordance with the magnitude of the count value $\phi$. Thus, the above-described circuit forms a sort of phase locked loop in which the valve of $\sin(\theta-\phi)$ is made equal to zero. As a consequence, the count value $\phi$ of the counter 24 indicates the instant position of the one magnetic sensor 16 within a magnetic domain. When the first-named counter has 8 to 10 bits, the degree of resolution by the count value is in a range from 1/256 to 1/2048 of length of one magnetic domain.

Figure 1:
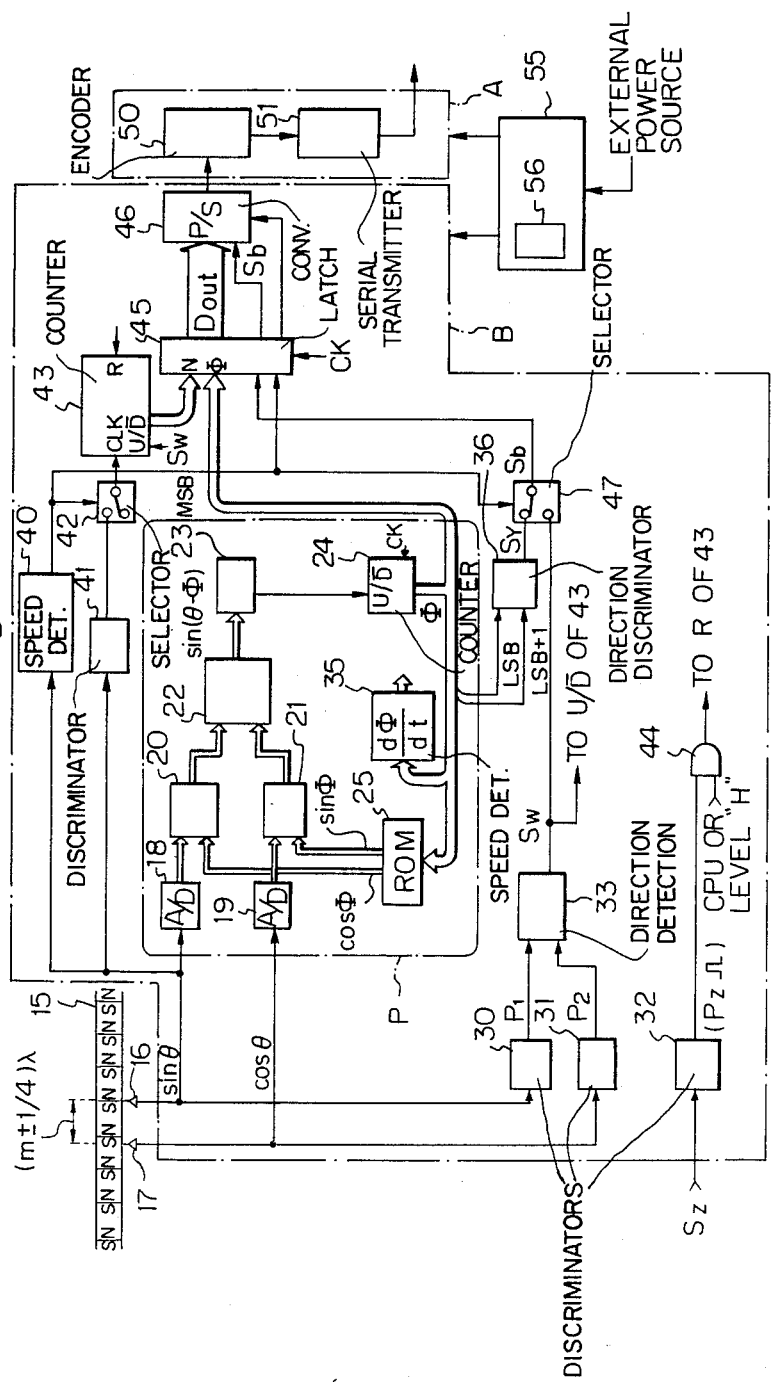
FIG. 1 is a circuit diagram of one embodiment of the displacement detector in accordance with the present invention.

One embodiment of the displacement detector in accordance with the present invention is shown in FIG. 1, in which circuit elements substantially corresponding to those used for the conventional circuit shown in FIG. 6 are indicated with same reference numerals.

A speed detector 40 is connected to the magnetic sensor 16 in order to detect the relative displacement speed between the sensors 16 and 17 and the scale 15 on the basis of the output signal $\sin \theta$ of the magnetic sensor 16. The speed detector 40 issues a "0" signal when the displacement speed falls short of a given standard speed, and a "1" signal when the displacement speed exceeds the standard speed. A wave shape discriminating circuit 41 is also connected to the magnetic sensor 16 in order to convert the output signal of the magnetic sensor 16 to a two value signal of "1" and "0" levels through discrimination with a given threshold value. A data selector 42 is connected to the wave shape discriminator 41 in order to selectively supply to a counter 43 either the highest bit MSB of the count value $\phi$ of the counter 24 in the phase locked loop P or the output signal of the wave shape discriminating circuit 41. When a "0" signal is supplied from the speed detector 40, the highest bit MSB of the count value $\phi$ is selected for supply to the counter 43. Whereas the output signal of the wave shape discriminating circuit 41 is selected for supply to the counter 43 when a "1" signal is supplied.

The up-down shifting terminal U/D of this counter 43 receives the output signal Sw of the direction discriminating circuit 33. The counter 43 counts input signal while shifting its counting mode in accordance with the output signal W. In the case of the illustrated example, the counter 43 performs up-mode counting when the magnetic sensors 16 and 17 move in the positive direction, and down-mode counting when the magnetic sensors move in the negative direction. The reset terminal R of the counter receives the zero-point pulse Pz passed from the wave shape discriminating circuit 32 via an AND gate 44. Thus, the counter 43 is reset every time the magnetic sensors 16 and 17 arrive at the reference position. Since either the highest bit MSB of the count value $\phi$ of the counter 24 or the output signal of the wave shape discriminating circuit 41 is supplied to the counter 43, the count value of the counter 43 indicates the number of magnetic domains on the scale 15 passed the magnetic sensors 16 and 17 between the instant and reference positions. Thus, the counter 43 corresponds in function to the counter 34 used for the conventional circuit shown in FIG. 6. However the difference is that this counter 43 counts the highest bit MSB of the count value $\phi$ of the counter 24 in the phase locked loop P when the relative displacement speed between the magnetic sensors 16, 17 and the scale 15 falls short of the standard speed.

The phase locked loop P further includes a speed detector 35 which differentiate the count value $\phi$ of the counter 24 with time "t". Thus, the count value $\phi$ varies in accordance with the relative displacement speed. As a consequence, the rate of variation $d\phi/dt$ of the count value $\phi$ corresponds to the relative displacement speed between the magnetic sensors 16, 17 and the scale 15 and the speed detector 35 issues a speed signal.

A latch circuit 45 is connected to the counters 43 and 24 in order to receive the output signal N of the counter 43 and the count value $\phi$ of the counter 24. The latch circuit 45 latches the input signal with a system clock pulse CK and passes a displacement data Dout to a parallel/serial converter 46. The output signal N forms the higher bits of the displacement data Dout whereas the count value $\phi$ forms the lower bits. In this way, synchronization with the parallel/serial shifting circuit 46 can be established.

The phase locked loop P is accompanied with a direction discriminating circuit 36 to discriminate the moving direction of the magnetic sensors 16 and 17 on the basis of the lowest bit LSB of the count value $\phi$ of the counter 24 and a value (LSB+1). A data selector 47 is connected to the direction discriminating circuits 33 and 36 in order to selectively supply to the latch circuit 45 either an output signal Sv of the discriminating circuit 36 or the output signal Sw of the discriminating circuit 33. The data selector 47 supplies the output signal Sv to the latch circuit 45 on receipt of the "0" signal from the speed detector 40. Whereas the output signal Sw is supplied to the latch circuit 45 when the "1" signal is received from the speed detector 40. In other words, the signal Sv is supplied to the latch circuit 45 as a direction signal Sb indicative of the moving direction of the magnetic sensors 16 and 17 when the relative displacement speed between the magnetic sensors 16, 17 and the scale 15 falls short of the standard speed. Whereas, the signal Sw is supplied to the latch circuit 45 as the direction signal Sb when the relative displacement speed exceed the standard speed. The latch circuit 45 passes to the parallel/serial converter 46 the direction signal Sb supplied via the data selector 47 and the output signal of the speed detector 40 after latching with the system clock pulse CK.

The parallel/serial converter 46 converts parallel data made up of the displacement data Dout and the direction signal Sb supplied from the latch circuit 45 into corresponding serial data. When the "0" signal is supplied from the speed detector 40, the displacement data Dout and the direction signal Sb are converted. In this case, the higher bits of the displacement data Dout is formed by the output signal of the counter 43 and the lower bits are formed by the count value $\phi$ of the counter 24. When the "1" signal is supplied from the speed detector 40, the higher bits of the displacement data Dout is formed by the output signal N of the counter 43 but the count value $\phi$ of the counter 24 is equal to zero. That is, the count value $\phi$ of the counter 24 in the phase-locked loop P is made invalid when the relative displacement speed between the magnetic sensors 16, 17 and the scale 15 exceeds the given standard speed.

The parallel/serial converter 46 is connected to a coder 50 which codes the serial data from the converter 46. The serial data is coded to one of NRZ, biphase, f/2f, double-current RZ, RZ, bipolar, dicode and NRZ1 codes. The coded signal is transmitted outside the system in a serial mode after addition of a check bit such as a parity bit by a driver 51. In this case, the driver 51 may be constructed to perform serial transmission under RS422, RS232C or RS423 standard. The driver

51 may also be constructed to perform optical fiber transmission.

A power source monitor circuit 55 including a battery 56 is provided. When power is externally supplied, the monitor circuit supplies the power to a circuit group B including the coder 50 and the driver 51 and to a circuit group A including other circuit elements. When the external power supply is canceled, power is supplied to the circuit group B only from the battery 56.

The above-described displacement detector operates as follows.

(I) In the first place, it is assumed that the relative displacement speed between the magnetic sensors 16, 17 and the scale 15 falls short of the standard speed.

In this case, a "0" signal from the speed detector 40 is on one hand supplied to the data selectors 42 and 47 and, on the other hand, to the parallel/serial converter 46 via the latch circuit 45. As a result, the highest bit MSB of the count value $\phi$ of the counter 24 is passed to the counter 43 via the data selector 42.

Via the latch circuit 45, displacement data Dout is supplied to the parallel/serial converter 46, which includes lower bits formed by the count value $\phi$ of the counter 24 and higher bits formed by the count value N of the counter 43. The output signal Sv of the direction discriminating circuit 36 is also supplied to the converter 46 as the direction signal Sb indicative of the moving direction of the magnetic sensors 16 and 17. As a consequence, the displacement data Dout and the direction signal are both converted into corresponding serial data which is then supplied to the coder 50 indicating the displacement with high degree of dissolution.

After coding, the serial data is transmitted outside the system by the driver 51 in the serial mode.

(II) In the second place, it is assumed that the relative displacement speed between the magnetic sensors 16, 17 and the scale 15 exceeds the standard speed.

In this case, a "1" signal from the speed detector 40 is on one hand supplied to the data selectors 42 and 47 and, on the other hand, to the parallel/serial converter 46 via the latch circuit 45. As a result, the output signal of the wave shape discriminating circuit 41 is passed to the counter 43 via the data selector 42.

Via the latch circuit 45, displacement data Dout is supplied to the parallel/serial converter, which includes lower bits formed by the count value $\phi$ of the counter 24 and higher bits formed by the count value N of the counter 43. The output signal Sw of the direction discriminating circuit 33 is also supplied to the converter 46 as the direction signal Sb indicative of the moving direction of the magnetic sensors 16 and 17. In this case, the count value $\phi$ of the counter 24 is made invalid.

After conversion, serial data is supplied to the coder 51 indicating the displacement with low degree of dissolution. After coding, the serial data is transmitted outside the system by the driver 51 in the serial mode.

When the relative displacement speed between the magnetic sensors 16, 17 and the scale is low or equal to zero, absolute displacement data of high degree of resolution is issued. Whereas absolute displacement data of low degree of dissolution is issued when the relative displacement speed is high.

(III) In the third place, it is assumed that the external power supply is canceled.

In this case, the battery 56 of monitor circuit 55 supplies power to the circuit group B which continues its operation without any intermission so that instant displacement data can be issued upon resumption of the external power supply.

In the case of the detection system to which the present invention is applied, the detection head made up of a pair of magnetic sensors issues three signals, i.e. a pair of output signals and a zero point signal indicating the reference position of the scale.

When the displacement detector of the present invention is used for a high speed type encoder, detection of displacement can be carried out at high degree of dissolution in the case of low speed relative movement In the case of high speed relative movement, however, the frequencies of the output signals are in the range of several MHz and such high frequencies of the output signals require high speed in the later stage signal processing, thereby causing difficulty in production and rise in cost. Higher harmonics interference is inevitably caused too.

When the displacement detector of the present invention is used for an ordinary type encoder, the frequencies of the output signals are in the range of about 200 Hz which is free from the troubles of high speed later stage signal processing and higher harmonics interference. In the case of low speed relative movement, however, detection of displacement cannot be carried out at high degree of dissolution.

Figure 2:
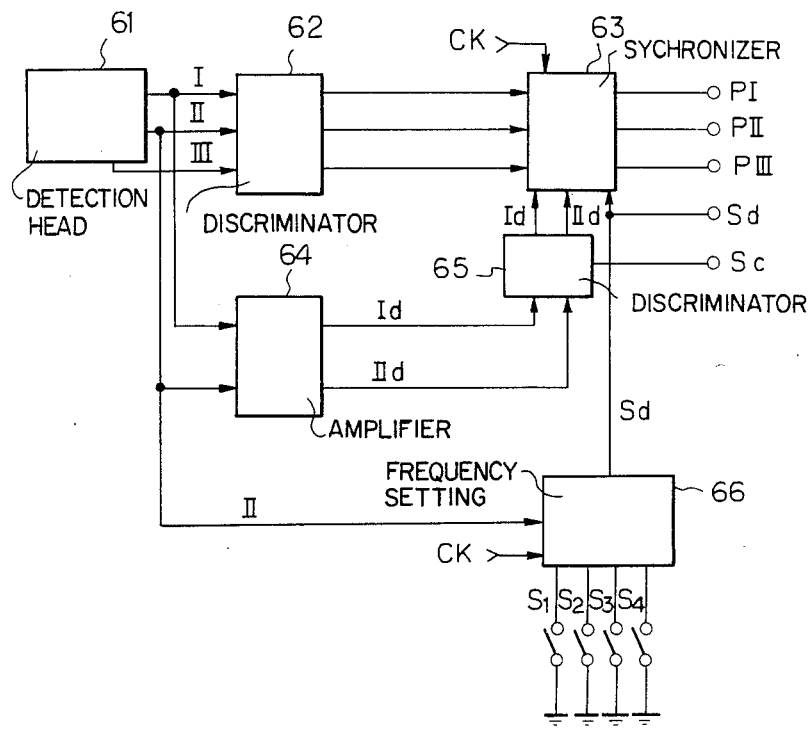
FIG. 2 is a circuit diagram of another embodiment of the displacement detector in accordance with the present invention.
Figure 3:
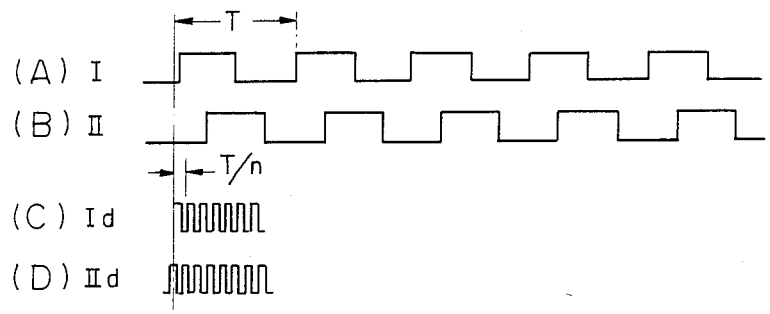
FIGS. 3 and 4 are graphs for showing signals processed in the circuit shown in FIG. 2.
Figure 5:
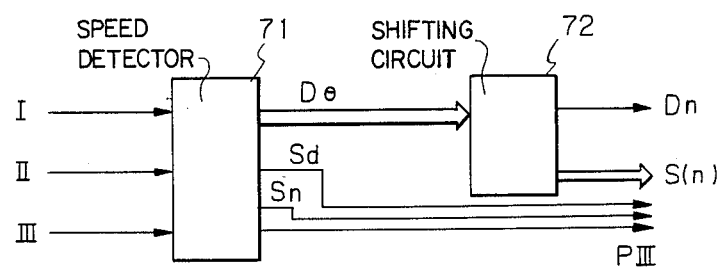
FIG. 5 is a circuit diagram of the other embodiment of the displacement detector in accordance with the present invention.

Further embodiments of the present invention shown in FIGS. 2 and 5 are proposed in order to remove the above-described drawbacks inherent in the conventional detection of displacement.

In the circuit shown in FIG. 2, a detection head 61 issues three signals I, II, and III. The signals I and II are output signals of a pair of magnetic sensors forming the detection head 61 and the signal III is a zero point signal indicating the reference position of the scale. These signals I, II and III are passed to a synchronous circuit 63 via a wave shape discriminating circuit 62. In the case of this example, the signals I and II are given in the form of pulse signals shown in FIGS. 2(A) and 2(B). As illustrated, the pulse signals are phased by one-fourth period. In this case, the pulse signal I is ahead of the pulse signal II. When the relative movement between the detection head 61 and the scale is opposite, the pulse signal II is ahead of the pulse signal I.

The pulse signals I and II are passed to a magnifying circuit 64 too. The pulse signals I and II are here magnified n times, n being a positive integer, as shown in FIGS. 2(C) and 2(D), in which signals I d and II d indicate output signals of the magnifying circuit 64. The magnifying circuit 64 includes a phase locked loop. As a result of magnification, the periods of the signals I d and II d are 1/n of those of the signals I and II and the signals I d and II d are phased by one-fourth period. The pulses I d and II d are then passed to the synchronous circuit 63 via a direction discriminating circuit 65. The direction discriminating circuit 65 detects the direction of the relative movement on the basis of the phase relationship between the signals I and II, and issues a signal Sc("0" or "1") indicative of the direction of the relative movement.

Figure 4:
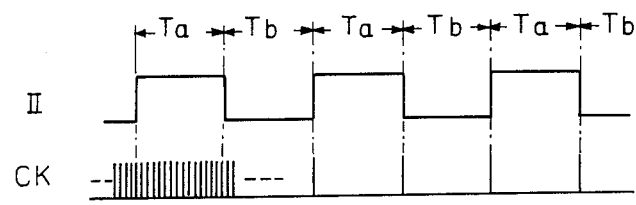

The signal II is passed to a frequency setting circuit 66 too. When the signal II is at the "1" level, this circuit 66 counts system clock pulses CK and compares the count value with a reference value selected by manual switches S1 to S4. When the signal II is at the "0" level, this circuit 66 clears the count value, and issue a signal Sd when the count value exceeds the reference value. That is, in FIG. 4, the system clock pulses CK are counted during periods Ta, and the count value is cleared with issue of the signal Sd during periods Tb.

When the signal Sd is supplied, the synchronous circuit 63 generates pulse signals P I and P II corresponding to the pulse signals I and II. When the signal Sd is not supplied, the synchronous circuit 63 generates pulse signals P I and P II corresponding to the pulse signals I d and II d. Regardless presence of the signal Sd, the synchronous circuit 63 generates a pulse signal P III corresponding to the zero-point signal III. Thus, depending on the present of the signal Sd from the frequency setting circuit 66, either the pulse signal I and II or the pulse signals I d and II d are selectively chosen for generation of the signals P I and P II at the synchronous circuit 63. In this case, the synchronous circuit 63 latches the supplied signals by the system clock pulses CK for synchronization at switching of the signals to be chosen.

In the case of low speed relative movement between the detection head 61 and the scale, the frequency setting circuit 66 does not issue the signal Sd and the synchronous circuit 63 issues the pulse signals P I and P II taken from the pulse signals I d and II d, thereby assuring detection of displacement at high degree of dissolution. Absence of the signal Sd indicates the fact that magnified pulse signals are currently issued. The value of the signal Sc indicates the direction of the relative movement between the detection head and the scale.

In the case of high speed relative movement over the reference value chosen by the manual switches S1 to S4, the frequency setting circuit 66 issues the signal Sd and the synchronous circuit 63 issues the pulse signals P I and PII taken from the pulse signals I and II. Since the frequencies of the pulse signals I and II are lower than those of the magnified pulse signals I d and II d, higher harmonics interference can well be avoided and no high speed later stage signal processing is required.

As a substitute for the manual switches S1 to S4, proper external reference value data may be supplied to the system.

FIG. 5 depicts another embodiment of the switching system. In this case, the signals I and II are given in the form of sin θ and cosθ just as the embodiment shown in FIG. 1. The signals I and II are passed to a speed detecting circuit 71. This circuit 71 performs wave shape discrimination of the signals I and II to form square waves such as used in the embodiment shown in FIG. 2. From the phase relationship between the square waves, the circuit 71 detects the direction of the relative movement and issues a signal Sd indicative of the direction. The circuit 71 also issues one or both of the square waves as speed signals Sv. The circuit 71 further abstracts, by use of a PLL circuit, θ from the signals I and II and issues a digital signal Dθ made up of a number of bits.

This digital signal Dθ is then passed to a bit shifting circuit 72 which performs sequential shifting from the lowest to higher bits of the signal Dθ at switching from the low to high relative movement between the detection head and the scale for output. That is, the output signal Dn of the bit shifting circuit 72 is an one bit signal between Dθ min and Dθ max (the original signal). The bit shifting circuit 72 also issues a signal S(n) indicative of the bit number currently selected. The bit shifting circuit 72 performs detection of speed by, for example, checking the frequency of the signal taken out from the lowest bit Dθ min of the digital signal Dθ.

In the case of low speed relative movement between the detection head and the scale, the bit shifting circuit 72 issues lower bits of the digital signal Dθ at high degree of dissolution. In the case of high speed relative movement, the bit shifting circuit 72 issues higher bits of the digital signal Dθ, thereby keeping the output frequency low.

We claim:

1. A displacement detector for an encoder comprising
   a detection head arranged facing a scale of said encoder and being relatively movable with respect thereto and being effective for generating a pair of phased output signals corresponding to the intensity of a signal stored in said scale,
   first and second A/D converters connected to said detection head for digitalizing said output signals,
   a function generating and multiplying unit connected to said first and second A/D converters for generating a first product of an output signal from said first A/D converter with a cosine value of prescribed data and a second product of an output signal from said second A/D converter with a sine value of said prescribed data,
   a reducer connected to said function generating and multiplying unit for calculating the difference between said first and second products,
   a first counting unit connected to said reducer and said function generating and multiplying unit for counting a difference between said products, for shifting its mode of counting depending on the polarity of said difference, and for passing its count value as said prescribed data to said function generating and multiplying unit,
   a signal switching unit connected to said detection head and said first counting unit, which detects a speed of said relative movement, selects one of said output signals from said detection head after wave shape discrimination when said speed exceeds a standard speed, and selects a signal in the highest bit of said count value from said first counting unit when said speed falls below said standard speed,
   a second counting unit connected to said signal switching unit for counting an output signal from the latter, and
   a parallel/serial converting unit coupled to said second counting unit and said first counting unit and effective for converting into first serial data first absolute displacement data which includes lower bits formed by said count value of said first counting unit and higher bits formed by a count value of said first counting unit, when said speed of said relative movement falls below said standard speed, and for converting into second serial data second absolute data which includes higher bits formed by said count value from said second counting unit and reset lower bits, when said speed exceeds said standard speed.

2. A displacement detector as claimed in claim 1 further comprising
   a power source monitor circuit connected to the above-described circuit elements for supplying battery voltage when an external power source is deactivated.

3. A displacement detector as claimed in claim 1 or 2 in which
   said scale stores a magnetized pattern, said detection head includes first and second magnetic sensors connected to said first and second A/D converters, respectively and said first and second magnetic sensors are spaced from each other by a distance corresponding to one-fourth of the period of said magnetized pattern.

4. A displacement detector as claimed in claim 1 or 2 in which said function generating and multiplying unit includes first and second multipliers connected to said first and second A/D converters, respectively, and a function generating ROM connected to the input sides of said multipliers.

5. A displacement detector as claimed in claim 1 or 2 in which said first counting unit includes a counter and a comparator interposed between said reducer and an up-down shifting terminal of said counter, and said comparator issues a signal which is equal to 1 when the result of reduction is positive, and to 0 when the result of reduction is negative.

6. A displacement detector as claimed in claim 1 or 2 in which said signal switching circuit includes a speed detector connected to said detection head, a wave shape discriminating circuit connected to said detection head, and a data selector connected to said speed detector, said wave shape discriminating circuit and said first counting unit.

7. A displacement detector as claimed in claim 1 or 2 in which said parallel/serial converting unit include a latch circuit and a parallel/serial converter connected to the output side of the latch circuit.

8. A displacement detector as claimed in claim 1 or 2 in which said first and second A/D converters, said function generating and multiplying unit, said reducer and said first counting unit form a shape locked loop.

9. A displacement detector as claimed in claim 1 or 2 further comprising means for generating a divided signal which has a frequency larger than those of said output signal from said detection head for n or 2n times, n being a positive integer, and a signal selecting circuit which detects said speed of said relative movement, selects said output signal directly from said detection head when said speed exceeds said standard speed, and selects said divided speed when said speed falls short of said standard speed.

10. A displacement detector as claimed in claim 9 in which said signal selecting circuit includes means for freely setting said standard speed.

11. A displacement detector as claimed in claim 9 in which said standard speed is set by an externally supplied signal.

* * * * *